(12) United States Patent
Jensen

(10) Patent No.: US 7,372,917 B2
(45) Date of Patent: May 13, 2008

(54) DIGITAL ALGORITHM FOR ON-LINE ACPR OPTIMIZATION IN POLAR RF TRANSMITTERS

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 587 days.

(21) Appl. No.: 10/944,551

(22) Filed: Sep. 17, 2004

(65) Prior Publication Data

US 2006/0062325 A1    Mar. 23, 2006

Related U.S. Application Data

(63) Continuation-in-part of application No. 10/925,485, filed on Aug. 25, 2004.

(51) Int. Cl.
H04L 25/49 (2006.01)
H04B 1/04 (2006.01)

(52) U.S. Cl. ................................ 375/296; 455/127.1

(58) Field of Classification Search ........ 375/295–297, 375/300, 302, 259, 268, 269, 271, 284, 285; 330/149; 455/127.1, 91, 114.2, 114.3
See application file for complete search history.

(56) References Cited

U.S. PATENT DOCUMENTS

| | | | | |
|---|---|---|---|---|
| 6,018,524 A | * | 1/2000 | Turner et al. ............... | 370/392 |
| 6,288,610 B1 | * | 9/2001 | Miyashita ................... | 330/149 |
| 7,212,791 B2 | * | 5/2007 | Arayashiki .................. | 455/91 |
| 2002/0041209 A1 | * | 4/2002 | Miyatani .................... | 330/149 |
| 2002/0101938 A1 | * | 8/2002 | Horaguchi et al. ......... | 375/297 |
| 2003/0021364 A1 | * | 1/2003 | Fan et al. ................... | 375/341 |
| 2004/0116083 A1 | * | 6/2004 | Suzuki et al. ............... | 455/126 |
| 2005/0079835 A1 | * | 4/2005 | Takabayashi et al. .... | 455/127.1 |
| 2005/0213685 A1 | * | 9/2005 | Takabayashi et al. ...... | 375/296 |

* cited by examiner

*Primary Examiner*—Tesfaldet Bocure
*Assistant Examiner*—Vineeta Panwalkar
(74) *Attorney, Agent, or Firm*—Garlick, Harrison & Markison; James A. Harrison

(57) ABSTRACT

An RF transmitter includes a digital processor that includes a time shift signal determination block that produces a time shift signal based upon a bleed over power level in an adjacent channel resulting from downstream phase and magnitude mismatch of a primary signal. In one embodiment, the time shift signal determination block includes logic and circuitry for determining a power ratio for a primary signal between a bleed over power level in an adjacent channel and the primary channel. The time shift signal determination block produces the time shift signal to a time shift block that is operably coupled to receive one of an envelope magnitude component and a phase component from a digital signal generation block, wherein the time shift block generates a time shift in at least one of the envelope signal path and the phase signal path based upon the time shift signal.

19 Claims, 11 Drawing Sheets

DIGITAL ALGORITHM FOR ON-LINE ACPR OPTIMIZATION IN POLAR RF TRANSMITTERS

CROSS-REFERENCE TO RELATED APPLICATION

The present U.S. Utility Patent Application claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:

1. U.S. Utility application Ser. No. 10/925,485, entitled "Digital Delay Element for Delay Mismatch Cancellation in Wireless Polar Transmitters,", filed Aug. 25, 2004, pending.

BACKGROUND

1. Technical Field

The present invention relates to wireless communications and, more particularly, wideband wireless communication systems.

2. Related Art

Modern radio frequency (RF) transmitters for applications, such as cellular, personal, and satellite communications, employ digital modulation schemes, such as frequency shift keying (FSK) and phase shift keying (PSK), often in combination with Code Division Multiple Access (CDMA) communication. Some of these communication schemes, for example the 270.83 kbit/s binary Gaussian FSK employed in the GSM cellular telephony standard, have constant envelopes and the transmitter signal, $s_{RF}(t)$, may be represented mathematically as $$s_{RF}(t)=R\cos(2\pi f_c t+\theta(t)), \quad (1)$$

where R denotes a constant amplitude, $f_c$ denotes the RF carrier frequency, and $\theta(t)$ denotes the information bearing part of the transmitted signal. An example transmitter appropriate for such constant-envelope modulation schemes is referred to as a translational loop transmitter. In this transmitter architecture, the digital baseband data enters a digital processor that performs the necessary pulse shaping and modulation to produce an intermediate frequency (IF) carrier fIF signal. The resulting digital signal is converted to analog using a digital-to-analog converter (DAC) and a low pass filter (LPF) that filters out undesired digital images of the IF signal. A phase locked loop (PLL)then translates, or shifts, the IF signal to the desired RF frequency channel and a power amplifier (PA) delivers the appropriate transmit power to the antenna.

According to related art, a radio transmitter includes a digital processor coupled to receive digital baseband data and produces a digital waveform characterized by an intermediate frequency and a phase. The output of the digital processor is produced to a DAC that is capable of processing intermediate frequency digital data while avoiding unnecessary quantization noise to produce an analog outgoing signal to a low pass filter. The low pass filter removes harmonics of the analog output of the DAC and produces an outgoing low pass filtered signal to a translational loop that up-converts the analog signal from an intermediate frequency to a radio frequency. The phase information originally produced by the digital processor is maintained in the RF signal produced by the translational loop to a power amplifier for amplification and radiation from an antenna.

The described radio transmitter is simplistic and is intended to represent various embodiments of RF transmitters, including embodiments in which the processing described occurs for both in-phase and quadrature phase signal paths (I and Q signal paths, respectively).

One typical radio transmitter used for GSM cellular telephony includes a digital processor that delivers a phase signal, $\theta(t)$, to the transmitter for further processing and RF transmission. The transmitter is typically a digital baseband processor that performs the necessary pulse shaping, modulation, and interpolation filtering, followed by in-phase and quadrature digital-to-analog converters, low pass reconstruction filters, and analog baseband mixers. A summing node combines the mixer outputs that are followed by low pass filtering. The remaining components of the transmitter are a phase and frequency detector (PFD), 26 MHz crystal reference (X-TAL), a charge pump (CP), a loop low pass filter (LOOP FILTER), a voltage controlled oscillator (VCO), a pair of offset mixers, as well as appropriate low pass filters. RF channel selection is achieved by employing a Fractional N frequency synthesizer. Within the translational loop, a sum of the mixing products of the baseband I & Q components is low pass filtered with down-converted RF output I & Q and is phase compared with a 26 MHz clock to generate a 26 MHz sinusoid whose excess phase component equals the difference between the desired baseband phase signal and the RF output phase signal. The 26 MHz carrier is extracted by the PFD whose output is the phase error signal.

With proper PLL design, the closed loop tracking action causes the error signal to approach zero; hence, the phase of the RF output carrier from a voltage controlled oscillator is produced at 900 MHz which tracks the phase of the baseband signal, as desired.

Other types of digital communication schemes, such as the $3\pi/8$ offset, 8-level PSK employed in the EDGE cellular telephony standard, have non-constant envelope and the transmitter signal, $s_{RF}(t)$, can therefore be represented in quadrature form as $$s_{RF}(t)=i(t)\cos(2\pi f_c t)+q(t)\sin(2\pi f_c t), \quad (2)$$

or, equivalently, in polar form as $$s_{RF}(t)=r(t)\cos(2\pi f_c t+\theta(t)), \quad (3)$$

where both r(t) and $\theta(t)$ are information-bearing components of the transmitted signal. The signal components r(t) and $\theta(t)$ are referred to as the envelope and phase of $s_{RF}(t)$, respectively.

Transmitters in which a phase path is formed separate from an envelope path, as described above, are known as polar transmitters. One problem with polar transmitters, as will be described below, is delay mismatch between the phase and envelope components for the signals in the envelope and phase signal paths.

Delay mismatch may cause the translational loop output to be modulated by a time shifted envelope signal relative to the phase signal thereby causing an error in the transmitted RF signal. It should be noted that only delay mismatch between the envelope and phase signal paths has a detrimental effect on the transmitted signal. Any common delay along the envelope and phase signal paths does not affect the quality of the transmitted signal. One reason delay mismatch is problematic is that delay mismatch causes a phenomenon known as spectral re-growth, which results in an elevated power spectrum that may violate spectral mask requirements.

FIG. 1 is a diagram that illustrates delay mismatch between signals that are expected to be synchronous. In polar transmitters, for example, a phase signal component is desirably expected to arrive simultaneously with a phase signal to amplitude modulate the phase signal. FIG. 1, therefore, provides one example of a delay mismatch in which a phase signal is delayed relative to an envelope signal by a slight amount, shown as dt. For example, FIG. 1 may represent a phase signal that is delayed relative to an envelope signal in a polar transmitter by a value of 20 nano-seconds. Ideally, in a polar transmitter, such phase and envelope signals should be aligned for proper operation of the polar transmitter. One problem that is observable for such delay mismatch is that of spectral re-growth resulting in sustained spectral mask violations in adjacent channels.

FIG. 2 is a diagram that shows several example RF signal output power spectra corresponding to an Enhanced Data rate GSM Evolution (EDGE) signal with various delay mismatches between the envelope and phase signal paths of the RF polar transmitter. FIG. 2 illustrates values of adjacent channel power due to delay mismatch for adjacent channels 1, 2 and 3 (first, second and third adjacent channels) for frequency offset values of 0 Hz to 1 MHz. As may be seen in FIG. 2, the significant impact of delay mismatch, for example with a delay mismatch of 80 nS or greater, is that the spectral mask requirement of −54 dBc at 400 kHz offset is not satisfied. As may be seen, adjacent channels to a channel carrying a primary signal experience a corresponding spectral power growth or influence from delay mismatch in the primary channel. Such adjacent channel power growth due to a primary channel delay mismatch may be evaluated in terms of an Adjacent Channel Power Ratio (ACPR). Such channel power growth is undesirable because design/standards-based spectral mask requirements may be violated. In order to restore the RF transmitter performance, delay mismatch must therefore be substantially canceled or reduced to reduce a value of ACPR if the ratio is calculated with the adjacent channel power in the numerator and the primary channel power in the denominator of the ratio. The delay mismatch may be reduced or canceled by introducing one of a positive or negative delay of a signal in one of the paths.

It is clear from the foregoing description of the related art, that a method and an apparatus are needed that addresses the problems of delay mismatch and that finds a method for minimizing adjacent channel power ratios as defined herein while adhering to spectral mask requirements to improve performance of polar transmitters that are presently being designed.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 3:
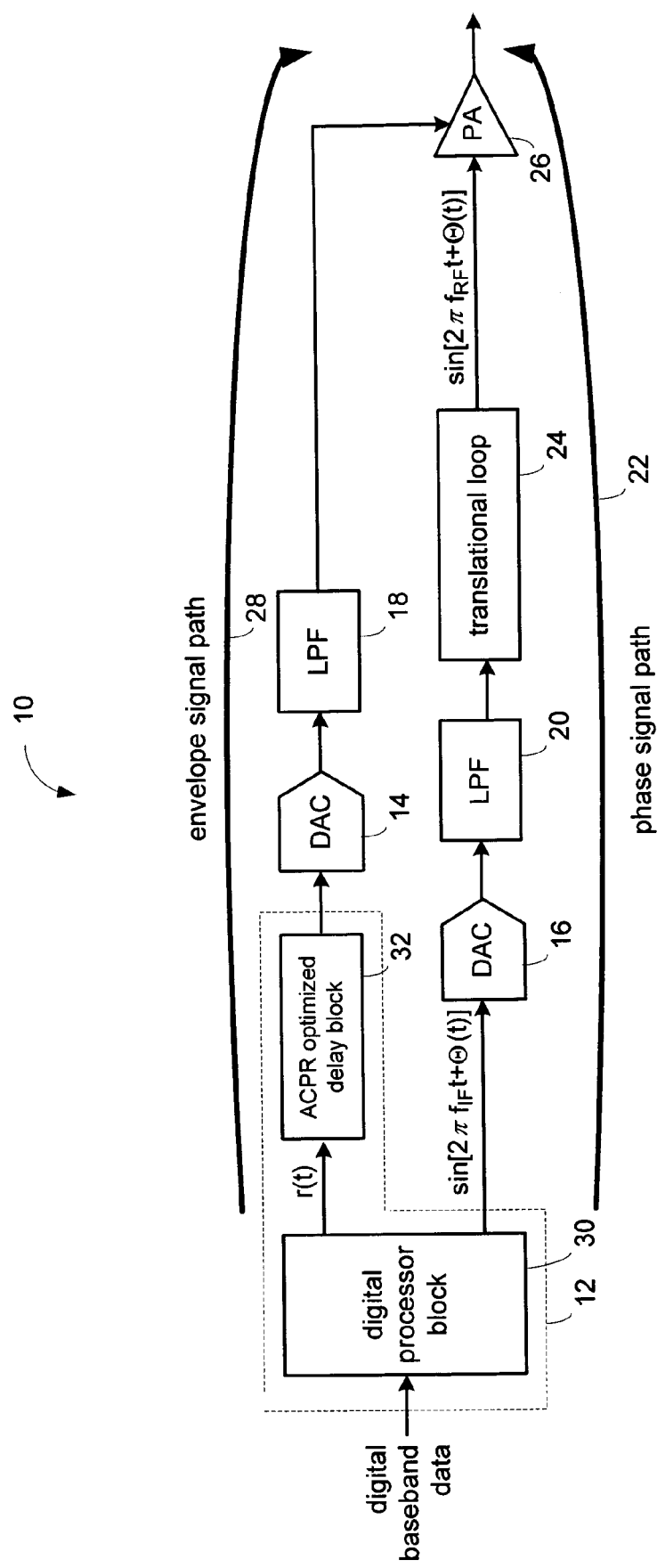
FIG. 3 is a block diagram of an RF transmitter architecture appropriate for non-constant-envelope modulation schemes according to one embodiment of the present invention.

FIG. 3 is a block diagram of an RF transmitter architecture appropriate for non-constant-envelope modulation schemes according to one embodiment of the present invention. Transmitter 10 is also referred to as a polar transmitter or an envelope elimination and restoration (EER) transmitter. As can be seen from FIG. 3, a digital processor 12 splits outgoing digital baseband data into envelope and phase components, converts the phase components to RF via a translational loop and joins the signals at the RF via an amplitude modulated PA.

More specifically, the envelope components and phase components are produced to first and second digital-to-analog converters (DACs) 14 and 16, respectively, which produce outgoing analog envelope and phase components, respectively, to first and second low pass filters (LPFs) 18 and 20, respectively. First and second LPFs 18 and 20 produce outgoing filtered envelope and phase components, respectively. The phase component, which is processed in a phase signal path shown by arrow 22, is then produced from LPF 20 to translational loop 24. Translational loop 24 then produces an RF frequency phase component, shown in FIG. 3 as "sin $[2\pi f_{RF}t+\theta(t)]$" to power amplifier (PA) 26. The envelope signal component produced by LPF 18 and conducted along an envelope signal path, shown by arrow 28, is then produced to PA 26 to amplitude modulate the phase component received at PA 26 from translational loop 24.

Generally, PA 26 generates the signal defined in equation (3) by effectively multiplying the envelope signal with the translational loop output. The magnitude of the envelope component (magnitude component) serves to modulate a signal and power level of the power amplifier. Typically, a common problem as described herein is that a delay mismatch between signals in the envelope and phase signal paths cause power spectral mask violations in adjacent channels due to spectral re-growth. As such, digital processor 12 includes a digital processor block and an ACPR optimized delay block that introduces one of a positive or negative delay in one of the phase and envelope signal paths to reduce delay mismatch.

In the embodiment shown in FIG. 3, digital processor 12 includes a digital processor block 30 and an ACPR optimized delay block 32 that is in the envelope signal path. As is suggested by FIG. 3, ACPR optimized delay block 32 may be formed within, and as a part of, digital processor 12, or as a separate logic block as shown within FIG. 3. In either embodiment, ACPR optimized delay block 32, as shown, serves to introduce a negative or positive amount of delay within the envelope path to minimize a calculated adjacent channel power ratio to eliminate spectral mask violations. ACPR optimized delay block 32 may readily be placed in phase signal path 22 as well.

Figure 4:
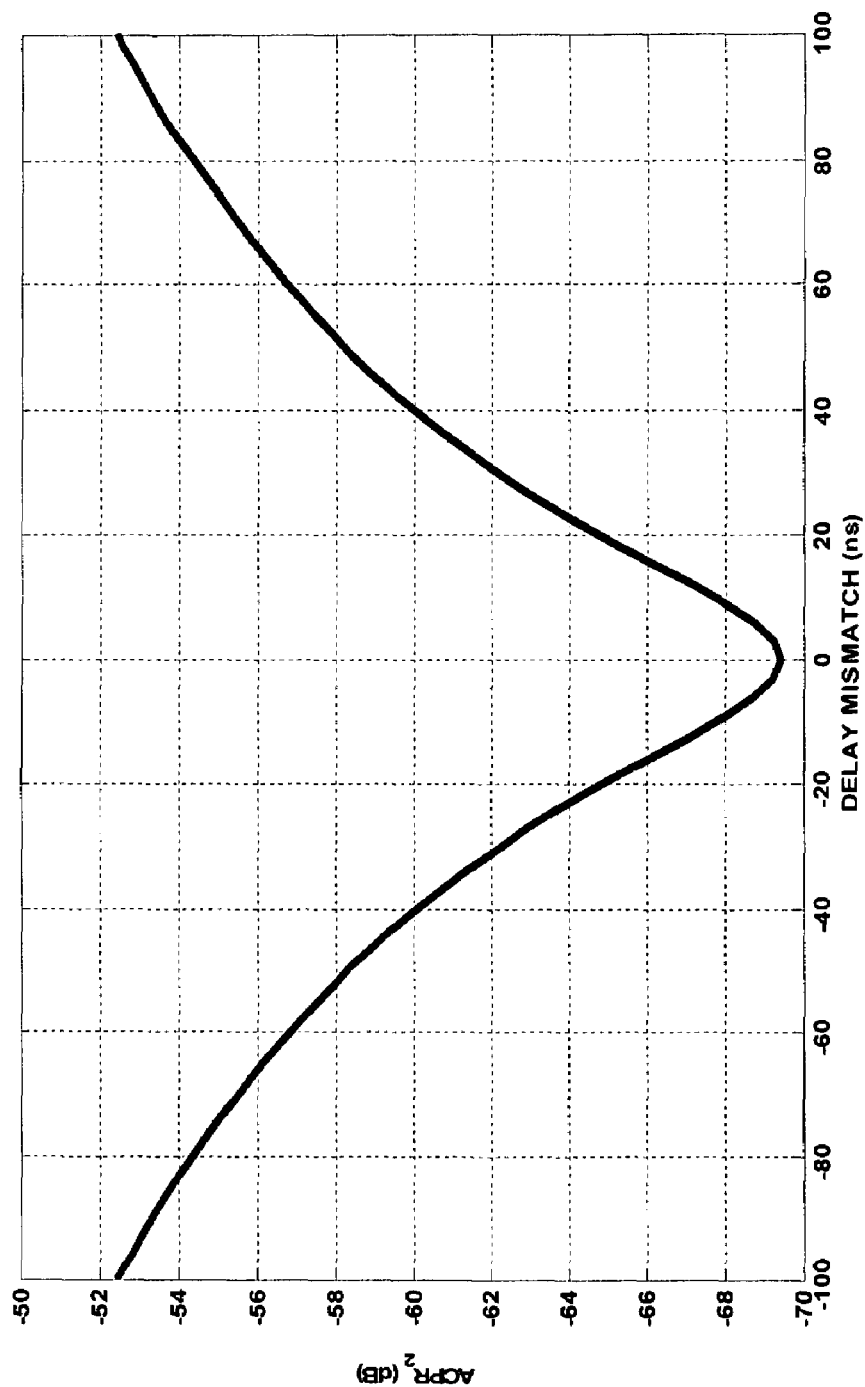
FIG. 4 is a diagram that illustrates as delay mismatch decreases to zero, an Adjacent Channel Power Ratio (ACPR) value approaches a global minimum.

As is shown in FIG. 4, as delay mismatch decreases to zero, the adjacent channel power ratio (ACPR) value approaches a global minimum. While FIG. 4 relates to delay adjustment of an envelope signal, the delay cancellation or adjustment may also occur along the phase signal path since only delay mismatch matters. The above discussions describe designs that are currently being considered and corresponding performance issues that relate to those designs. ACPR optimized delay block 32 is operable to approximately determine a delay value that yields a near or actual global minimum as is shown here in FIG. 4.

Figure 5:
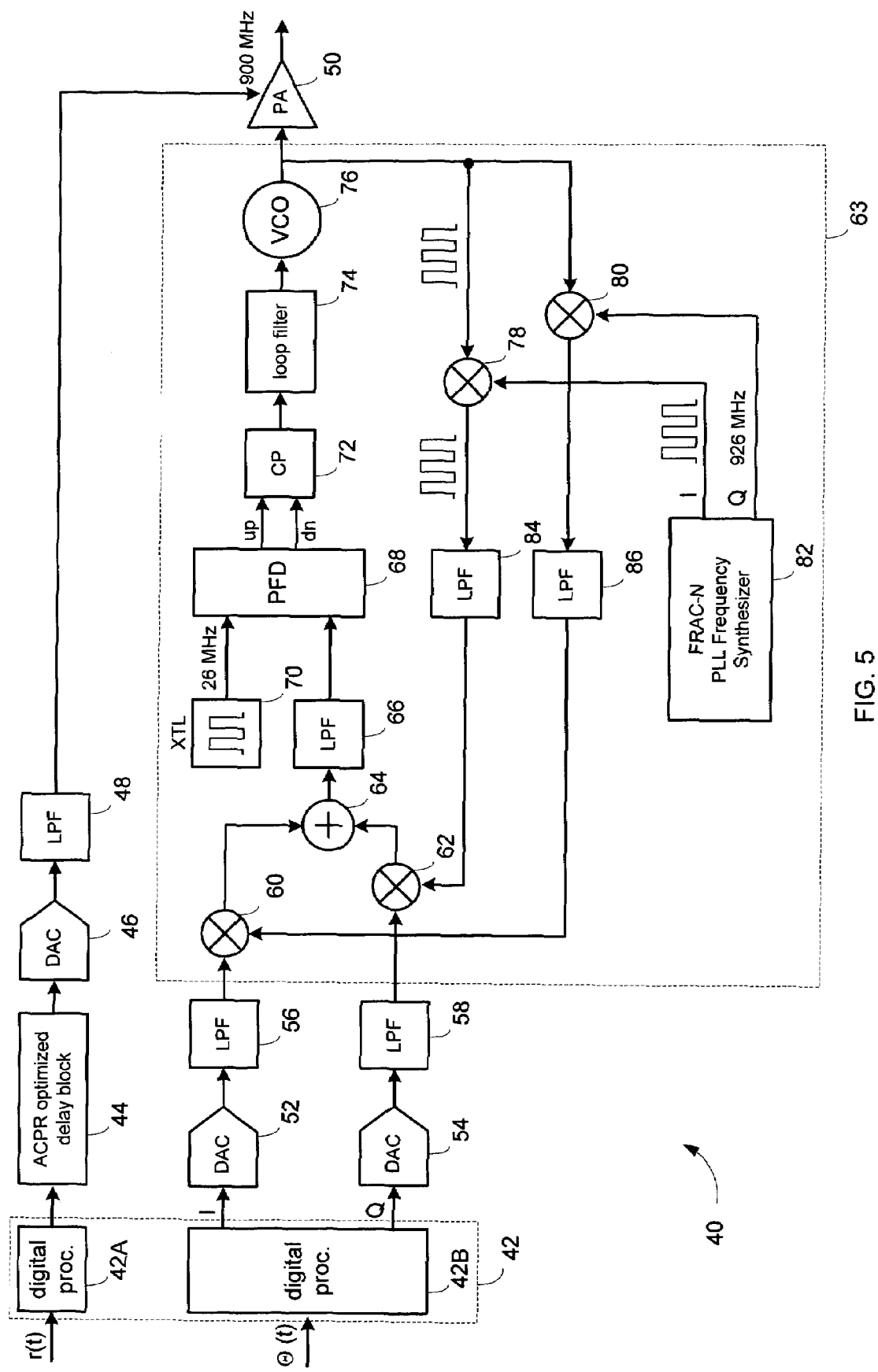
FIG. 5 is a block diagram that illustrates further details of an example implementation of the polar transmitter for Enhanced Data rate GSM Evolution (EDGE) cellular telephony applications.

FIG. 5 shows further details of an example implementation of the polar transmitter for the EDGE cellular telephony applications. In this block diagram, it is assumed that a baseband processor (not shown here in FIG. 5) of a transmitter 40 delivers envelope and phase signals, r(t) and θ(t), to a digital processor 42 of the transmitter 40 for further processing and RF transmission. The envelope signal is operated upon by digital processor block 42A that performs the necessary interpolation filtering and quantization prior to introduction of delay by ACPR optimized delay block 44 and digital-to-analog conversion by a down stream DAC 46.

ACPR optimized delay block 44 is coupled between the digital processor block 42A and DAC 46 and is operable to introduce an optimized amount of delay (positive or negative) in the envelope path to reduce or eliminate polar mismatch between the envelope based modulation of power amplifier 50 so as to synchronize the modulation with phase component signals received by power amplifier 50.

A digital output produced by ACPR optimized delay block 44 is produced to DAC 46 for conversion to an analog envelope signal. Undesired digital images produced by DAC 46 of the envelope signal are then filtered out by a LPF 48. After filtering, the envelope signal is used to directly modulate an output of power amplifier 50.

Transmitter 40 further includes a digital processor block 42B that is coupled to receive and operate upon phase signals θ(t) that are received from the baseband processor (not shown). Generally, in the described embodiment of the invention, digital processor block 42B of digital processor 42 produces I and Q components based upon received phase signals θ(t) to a pair of DACs 52 and 54, respectively. DACs 52 and 54 produce analog I and Q components of the phase signals to LPFs 56 and 58, respectively, that produce low pass filtered I and Q components to mixers 60 and 62, respectively, for up-converting to an intermediate frequency (IF). Mixers 60 and 62 are part of a translational loop section 63.

Up-converted I and Q components are then summed in adder 64 that produces a combined IF phase signal to a LPF 66 that low pass filters the combined IF and produces an IF phase signal component to a phase frequency detector 68. Phase frequency detector 68 compares the phase of the combined RF with a phase of an ideal source (here a crystal 70) and produces an error signal to a charge pump 72 that increases or decreases an output current level based upon whether the error signal indicates that current should be increased or decreased. The current of charge pump 72 is then produced to a loop filter 74 that produces a voltage to a voltage controlled oscillator (VCO) 76. VCO 76 produces an RF oscillation based upon a signal magnitude of the voltage produced by loop filter 74 which is based upon the current produced by charge pump 72.

An output of VCO 76 is further produced by a pair of mixers 78 and 80 that are further coupled to receive I and Q components of a FRAC-N PLL frequency synthesizer 82 at about 926 MHz for creating down-converted IF signals that are produced to mixers 60 and 62 by way of LPFs 84 and 86, respectively, which use the down-converted IF signals (26 MHz in the described embodiment) to up-convert the baseband frequency signals to IF as previously described.

An ideal RF transmitter output signal power spectrum corresponding to the EDGE cellular telephony standard given in dB relative to the center of the signal includes signals whose power spectrum at RF is within a defined spectral mask. This mask represents the maximum allowable levels of the power spectrum as a function of frequency offset from the RF carrier in order for a given transmitter to qualify for EDGE certification. At a frequency offset of 400 kHz (0.4 MHz), the maximum allowable emission level is −54 dB relative to the carrier (dBc). Another RF transmitter quality measure of the EDGE standard is the modulation accuracy, which relates the RF transmitter modulation performance to an ideal reference signal. Modulation accuracy is stated in root-mean-square (RMS) and peak values and is specified in percentage format. For a given transmitter to qualify for EDGE certification, the RMS modulation error must be less than 9% and the peak modulation error must be less than 30%.

One cause of performance degradation of RF polar transmitters is the so-called delay mismatch between the envelope signal and the phase signal. In the above discussion, particularly as stated in relation to equation (3), it has been assumed that the envelope and phase signals are matched in the time-domain when the envelope and translational loop output is joined at the RF frequency. However, in practical RF polar transmitters, the envelope and phase signals traverse the transmitter via different processing paths and thus may experience different signal delay before arriving at the PA. These delay variations are the result of CMOS fabrication process variations, as well as temperature variations, that affect the analog circuitry of the signal paths slightly differently. Such delay mismatch typically has severe impact on the spectral mask margin, while the modulation accuracy is affected to a lesser degree.

Figure 6:
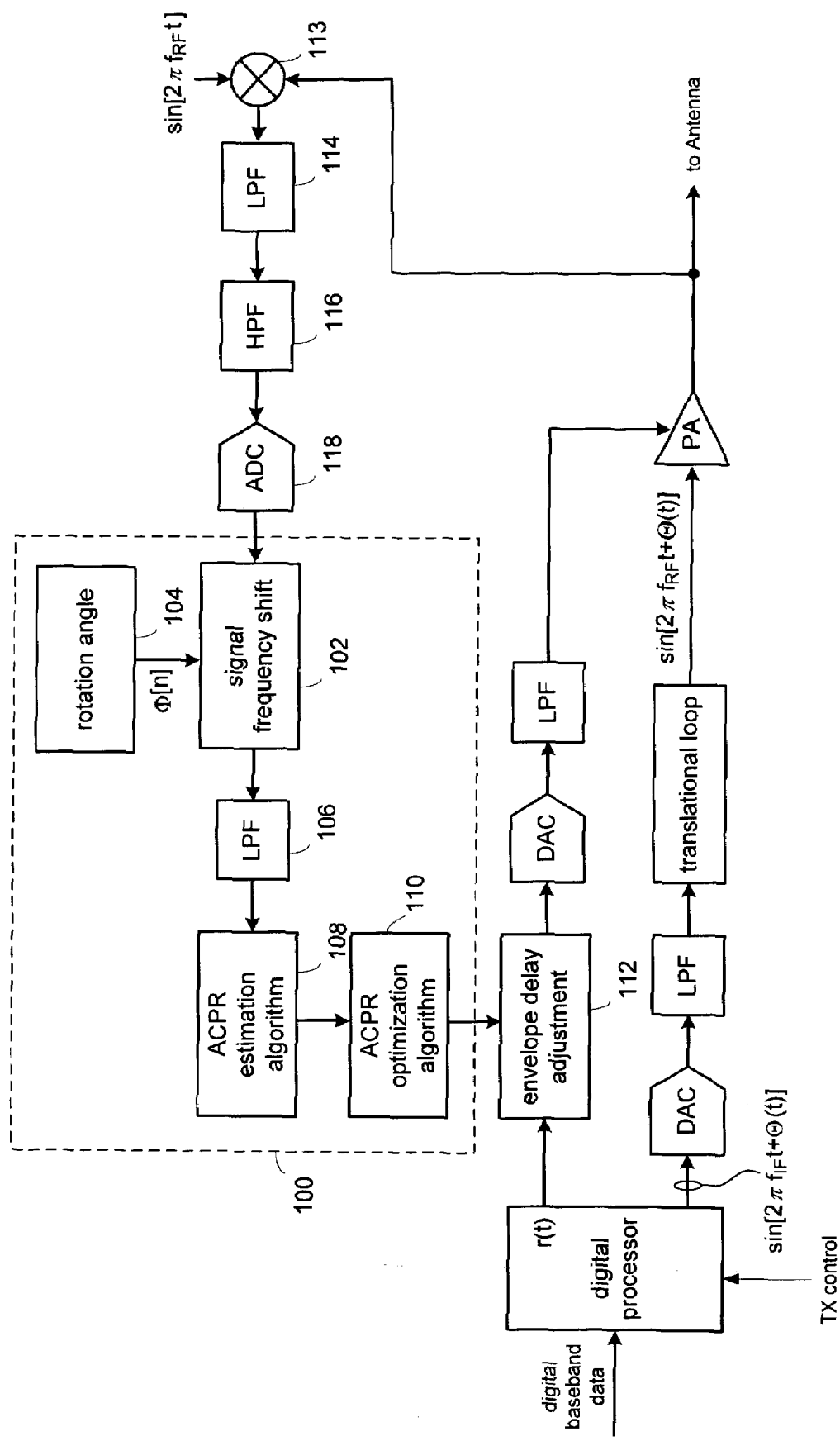
FIG. 6 is a functional block diagram of a digital modulator in accordance with an embodiment of the present invention.

FIG. 6 is a functional block diagram of a digital modulator in accordance with an embodiment of the present invention. The RF polar transmitter of FIG. 6 includes a plurality of processing blocks to produce a digital modulator suitable for a GSM, a general packet radio service (GPRS) radio transmitter, or an EDGE wireless polar RF transmitter. The digital modulator of the present invention is generally applicable to any polar RF transmitter intended to support continuous switching between PSK and FSK modes, although the described embodiment is directed to the EDGE standard and to any embodiment of the invention in which delay mismatch is a problem and an optimal delay adjustment is desirable.

More specifically, FIG. 6 illustrates a top level block diagram of an RF polar transmitter employing the invention for the case where delay mismatch cancellation occurs in the envelope signal path. ACPR optimization logic (time shift signal determination logic) includes a plurality of blocks contained within the dashed line shown at 100. ACPR optimization logic 100 includes five main blocks, namely, a signal frequency shift block 102, a rotation angle block 104, a low pass filter LPF block 106, an ACPR estimation algorithm block 108, and an ACPR optimization algorithm block 110. ACPR optimization algorithm block 110 produces an optimized delay value to envelope delay adjustment block 112. Envelope delay adjustment block 112 imposes an arbitrary delay upon the signal path (here, the envelope signal path for a polar transmitter). An example of such a high-fidelity delay mismatch cancellation algorithm is given in the U.S. patent application having a Ser. No. of 10/925,485, and a filing date of Aug. 25, 2004, which application is incorporated by reference herein.

In the described embodiment of the invention, ACPR optimization logic 100 operates at a clock rate of 3.25 MHz. This specific clock rate is merely an example. Many other choices of clock rates would be appropriate. Generally, calibration of the digital modulator 100 of a transmitter occurs online, i.e., in real-time, while transmission of data packets is taking place. The PA output of the transmitter is translated to baseband frequency by one or more mixing stages. Here in FIG. 6, the PA output is down-converted to baseband frequency by a mixer 113. An analog LPF 114 is coupled to receive the baseband frequency signal produced by mixer 113 to remove undesired harmonics of the signal. An analog high pass filter (HPF) 116 removes much of the low-frequency signal power, i.e., signal power for frequencies less-than, for example, 200 kHz, produced by LPF 114 in order to reduce the dynamic range requirement of analog-to-digital converter (ADC) 118 that follows.

During data packet transmission, the down-converted RF signal is converted to a digital signal representing the down-converted high pass and low pass filtered PA output signal digitized by ADC 118. The digital signal produced by ADC 118 is then produced to signal frequency shift block 102 of ACPR optimization logic 100 where the digital signal is frequency shifted by 400 kHz by the signal frequency shift block 102 and sharply low pass filtered by LPF block 106 in order to isolate the transmitted signal in an adjacent channel, such as adjacent channel 2 shown in FIG. 2. The power of the signal in the adjacent channel is calculated by the ACPR estimation algorithm block 108. An output value of ACPR estimation algorithm block 108 is produced to ACPR optimization algorithm block 110 which uses the calculated ACPR value to regulate the delay of the delay mismatch cancellation mechanism so that the ACPR is minimized. Specifically, ACPR optimization algorithm block 110 employs a binary search algorithm wherein the signal delay is varied in a systematic manner in exponentially decreasing step sizes such that the ACPR is driven to a minimum. The output of ACPR optimization algorithm block 110 defines a positive or negative amount of delay and is produced to envelope delay adjustment block 112 that, in turn, introduces the specified amount of delay into the envelope path of the radio transmitter of FIG. 5.

The requirements of the EDGE standard calls for a signal power spectrum measurement which is the average of at least 200 data packet transmissions, each consisting of 148 symbols. Accordingly, it is acceptable that some transmitted data packets violate the spectral mask requirements as long as the regulation of the delay mismatch cancellation mechanism is such that the vast majority of transmitted packets satisfy these requirements. After the initial calibration, therefore, the procedure is repeated with regular intervals to compensate for drift in component behavior caused by temperature changes.

Figure 7:
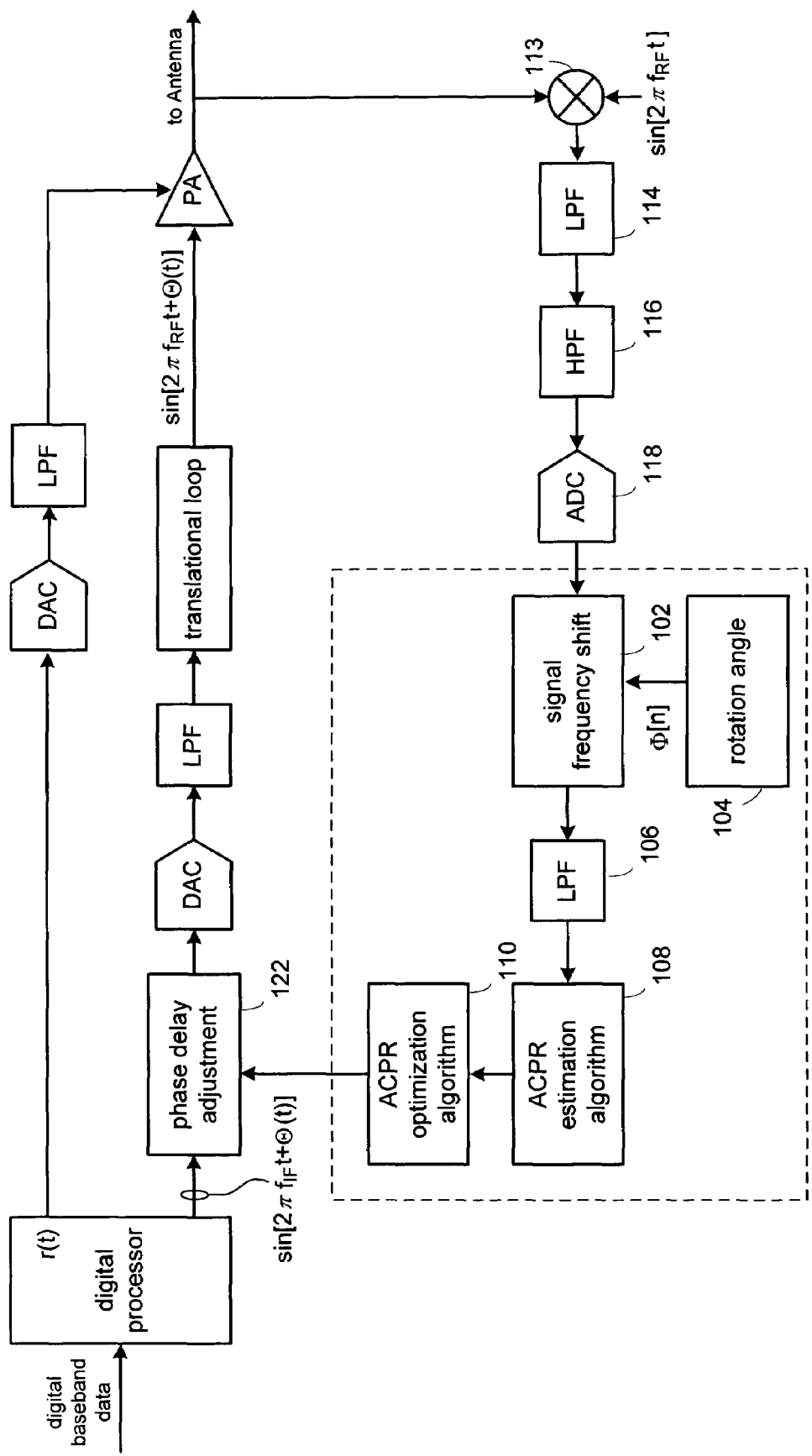
FIG. 7 is a block diagram that illustrates the top level block diagram of an RF polar transmitter employing the invention for the case where delay mismatch cancellation occurs in the phase signal path.

FIG. 7 shows the top level block diagram of an RF polar transmitter employing the invention for the case where delay mismatch cancellation occurs in the phase signal path. As in FIG. 6, an ACPR optimization logic 100 may be used to adjust delay mismatch in the phase path of a signal. The logic within ACPR optimization logic 100 operates independent of the two approaches for delay mismatch cancellation is implemented in the transmitter digital processor (delay mismatch cancellation in phase or envelope paths). The logic within ACPR optimization logic 100 is the same in both implementations of FIGS. 6 and 7. The output of ACPR optimization logic 100, however, is produced to a phase delay adjustment block 122 which, responsive thereto, produces a corresponding positive or negative delay in the phase path of the radio transmitter.

Figure 8:
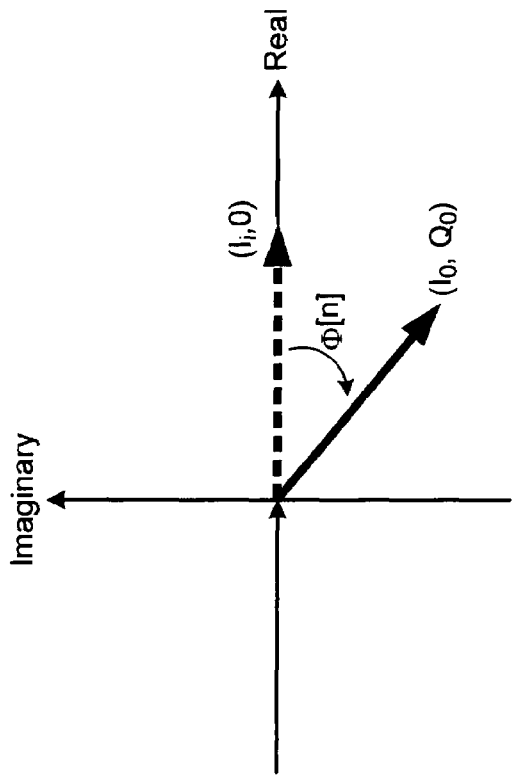
FIG. 8 illustrates a functional diagram of the operation of the signal frequency shift block according to one embodiment of the present invention.

FIG. 8 shows a functional diagram of the operation of the signal frequency shift block according to one embodiment of the present invention. As stated above, in the described embodiment, the signal frequency shift block 102 is operable to frequency shift the ADC output by −400 kHz such that the transmitted signal is shifted to DC in an adjacent channel. As is well known in the area of discrete-time signal processing, such frequency shift can be obtained by multiplication by a complex exponential sequence. Specifically, letting $I_i[n]$ denote the output of the ADC, frequency shifting can be obtained by multiplication of the complex sequence $$e^{j\Phi[n]}, \text{where} \qquad (4)$$

$$\Phi[n] = -\frac{2\pi n 0.4}{3.25}. \qquad (5)$$

Thus, it follows from (4) and (5) that frequency shifting $I_i[n]$ by −400 kHz is equivalent to rotating the complex plane vector $$(I_i[n], 0) \qquad (6)$$

by an angle equal to $\Phi[n]$. This rotation is depicted in FIG. 8. An efficient method of achieving such vector rotation is the so-called COordinate Rotation DIgital Computer (CORDIC) algorithm. The CORDIC algorithm, tailored to this application, is given in detail in Table 1 below.

TABLE 1

Details of one embodiment of the CORDIC algorithm used in
the Signal Frequency Shift block of FIG. 6 and FIG. 7.

```
INPUTS:
    Phi
    I_i
INTERNAL VARIABLES:         INITIAL VALUE:
    Re                          I_i
    Im                          0
OUTPUTS:
    I_o
    Q_o
for k=1 to N-1
    s = 2^-k;
    if Phi >= 0
        μ = 1;
    else
        μ = -1;
    end
    Phi = Phi - (μ * Arctangent(s));
    OldIm = Im;
    Im = Im + (μ * Re * s);
    Re = Re - (μ * OldIm * s);
end
I_o=Re;
Q_o=Im;
```

Figure 9:
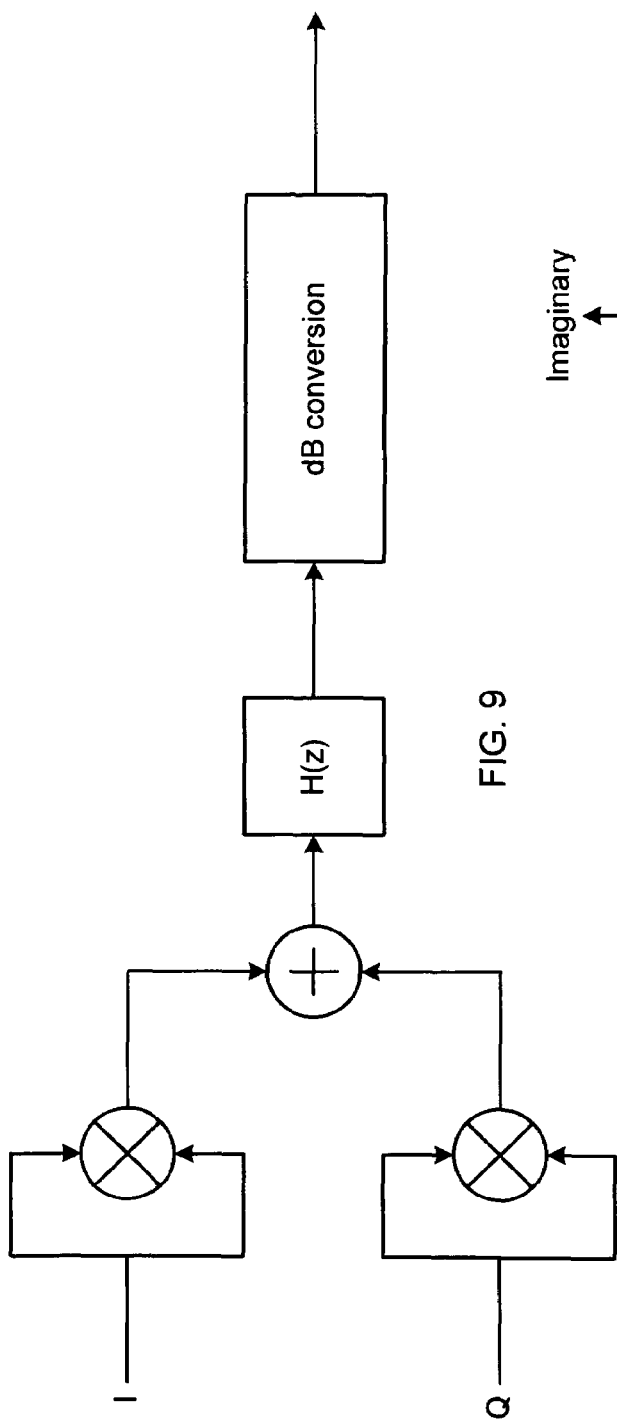
FIG. 9 is a diagram that illustrates details of an ACPR Optimization Algorithm.

FIG. 9 shows details of the ACPR optimization algorithm block. It is well known that the power of a complex discrete-time signal can be calculated as the time-average of the magnitude squared of the signal. Thus, since the preceding "LPF" block has isolated the second adjacent channel, the power of the transmitted signal within this channel may be calculated as $$P_2 = \lim\bigg|_{N \to \infty} \frac{\sum_{n=0}^{N} (I[n])^2 + (Q[n])^2}{N} \quad (7)$$

where I[n] and Q[n] denote the in-phase and quadrature components, respectively, of the signal. In practice, the infinite-length sum indicated in (7) must be approximated by a finite sum. The specific length of such a finite sum constitutes a compromise between accuracy, computational complexity and wait-time. The present invention averages over 148 symbols, i.e., one data packet, corresponding to H(z) of FIG. 9 implementing the filter $$H(z) = \frac{\sum_{i=0}^{147} z^{-i}}{148}, \quad (8)$$

but other averaging lengths are possible as well. The dB conversion block shown in FIG. 9 converts the measured power to decibels (dB) by performing the calculation $10 \times \log_{10}(P_2)$. Such calculation is typically implemented most efficiently using a lookup table (LUT).

TABLE 2

One embodiment of the ACPR optimization algorithm
block 110 of FIG. 6 and FIG. 7.

```
INPUTS:
    CurrentAcpr
CONSTANTS:              VALUE:
    SystemSettling      148
INTERNAL VARIABLES:     INITIAL VALUE:
    CurrentDelay        0
    DelayStep           0.25
    NumIterations       4
    AcprNeg             0
    AcprMid             0
    AcprPos             0
    CurrentState        1
    ClockCount          SystemSettling
OUTPUTS:
    TotalSignalDelay
loop
    TotalSignalDelay=CurrentDelay;
    switch CurrentState
        case 1,
            ClockCount=ClockCount-1;
            if ClockCount==0
                AcprMid=CurrentAcpr;
                CurrentDelay=CurrentDelay-DelayStep;
                ClockCount=SystemSettling;
                NextState=2;
            else
                NextState=1;
            end
        case 2,
            ClockCount=ClockCount-1;
            if ClockCount==0
                AcprNeg=CurrentAcpr;
                CurrentDelay=CurrentDelay+
                    (2*DelayStep);
                ClockCount=SystemSettling;
                NextState=3;
            else
                NextState=2;
            end
        case 3,
            ClockCount=ClockCount-1;
            if ClockCount==0
                AcprPos=CurrentAcpr;
                if (AcprMid<AcprNeg) &
                    (AcprMid<AcprPos)
                    Current Delay=CurrentDelay-
                        DelayStep;
                elseif (AcprNeg<AcprPos)
                    CurrentDelay=CurrentDelay-
                        (2*DelayStep);
                    AcprMid=AcprNeg;
                else
                    AcprMid=AcprPos;
                end
                NumIterations=NumIterations+1;
                if NumIterations <= MaxNumIterations
                    DelayStep = DelayStep / 2;
                    CurrentDelay = CurrentDelay -
                        DelayStep;
                    ClockCount=SystemSettling;
                    NextState=2;
                else
                    NextState=4;
                end
            else
                NextState=3;
            end
        case 4,
            NextState=4;
    end
```

Figure 1:
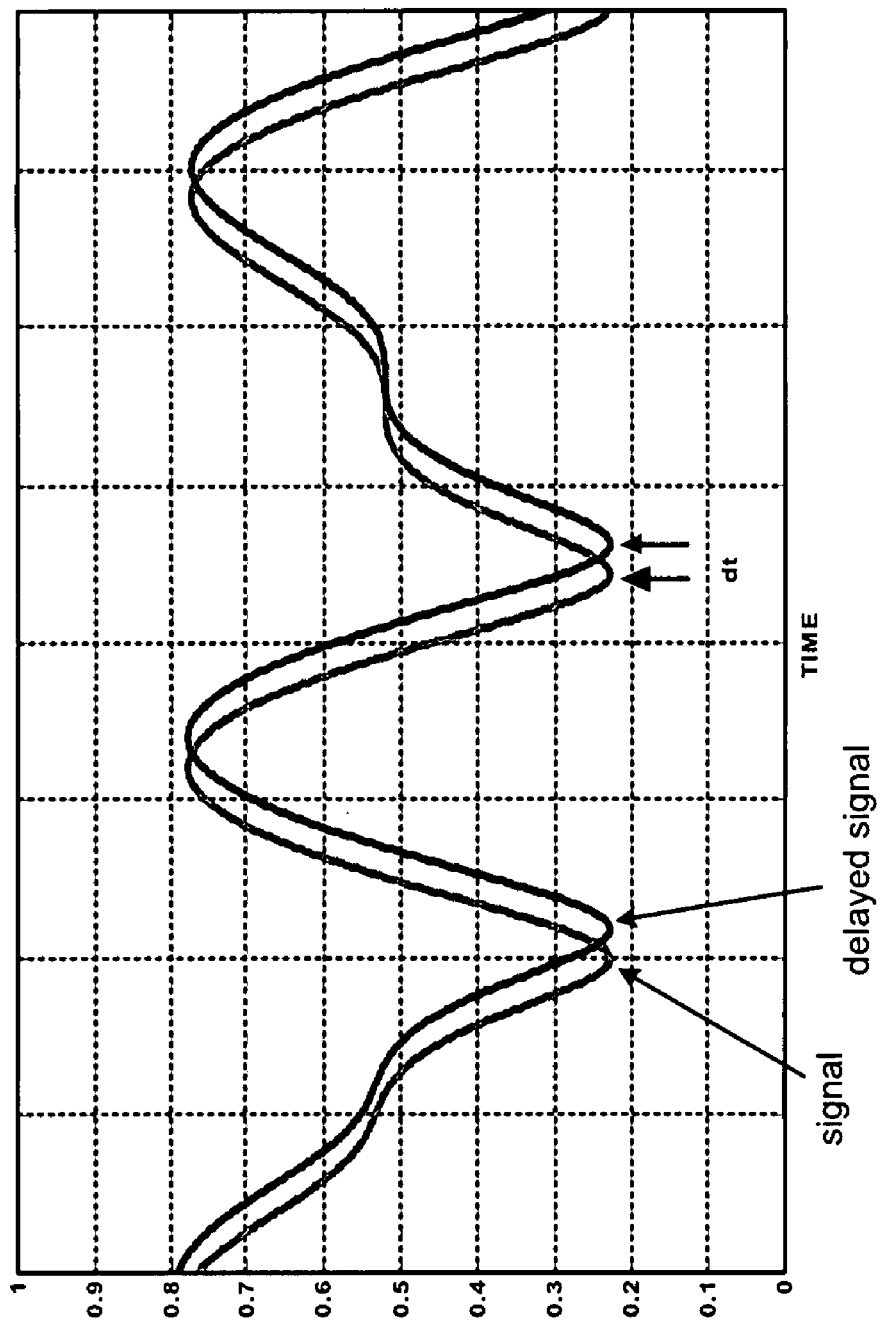
FIG. 1 is a diagram that illustrates delay mismatch between signals that are expected to be synchronous.
Figure 2:
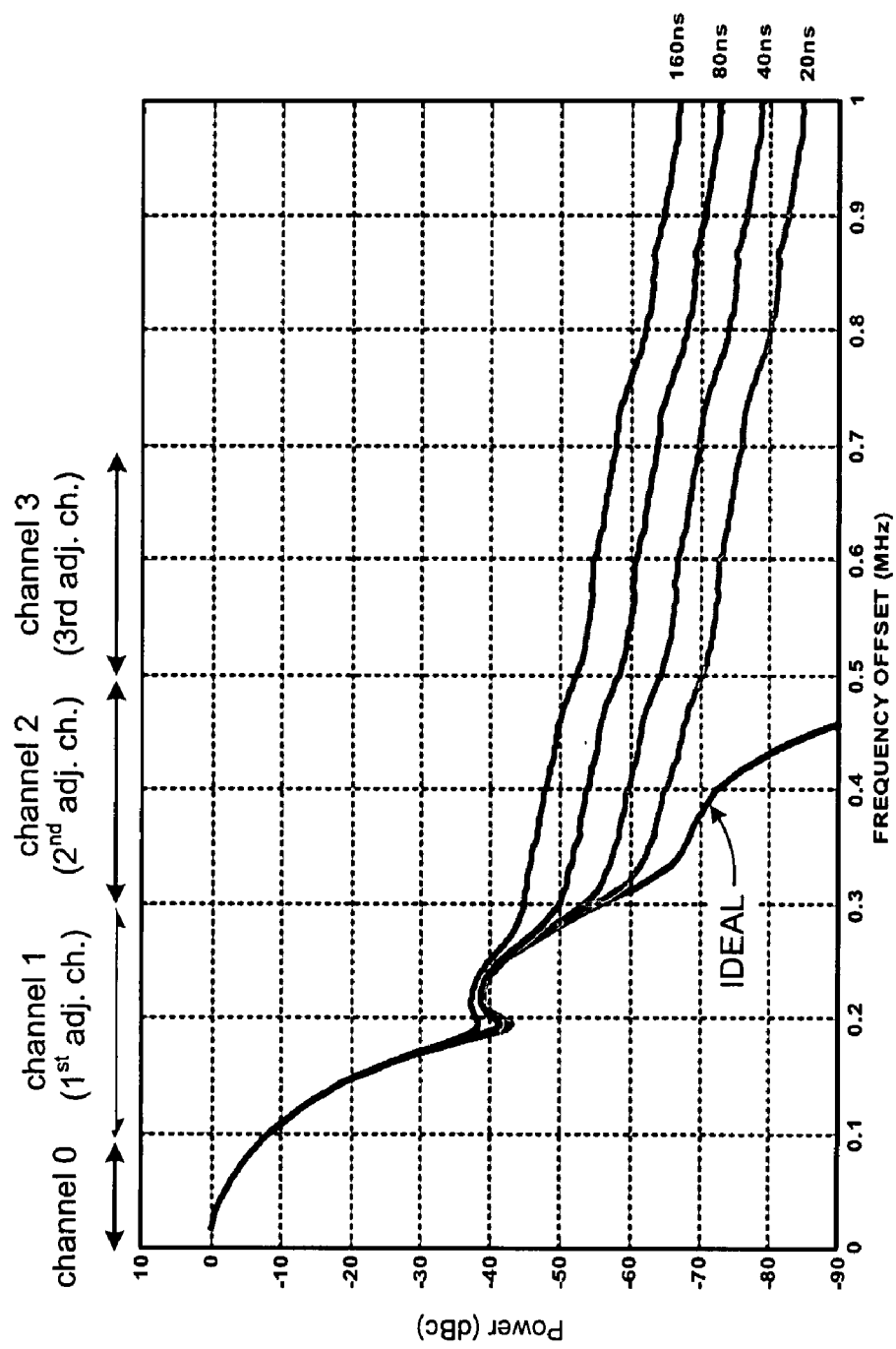
FIG. 2 is a diagram that shows several example RF signal output power spectra corresponding to an Enhanced Data rate GSM Evolution (EDGE) signal with various delay mismatches between the envelope and phase signal paths of the RF polar transmitter.

Table 2 shows details of one embodiment of the ACPR optimization algorithm block 110 of FIG. 6 and FIG. 7. ACPR optimization algorithm block 110 regulates the control of the delay mismatch cancellation mechanism such that the measured ACPR of an adjacent channel is minimized. As demonstrated by FIG. 1, minimal ACPR is achieved when delay mismatch is cancelled. Exploring the details of Table 2, the optimization algorithm is based upon the principle of binary search. The algorithm output, a parameter labeled "TotalSignalDelay", is initially set to zero and the corresponding ACPR is measured. In the described embodiment of the invention, the method is performed for the first adjacent channel which, in FIG. 2 is the second channel (channel 2).

Thereafter, negative and positive variations of "TotalSignalDelay" with a step size labeled "DelayStep" and an initial value of 0.25 are performed. Notice that delay is specified relative to the clock rate of the digital circuitry. In this example, the clock rate is 3.25 MHz. The resulting three values of ACPR, "AcprMid", "AcprNeg", and "AcprPos", respectively, are compared and the optimal value of "TotalSignalDelay" is chosen. Specifically, if "AcprMid"<"AcprNeg" and "AcprMid"<"AcprPos", the present best value of "TotalSignalDelay" is zero, otherwise, if "AcprNeg"<"AcprPos", the present best value of "TotalSignalDelay" is the negative value of "DelayStep", otherwise the present best value of "TotalSignalDelay" is "DelayStep". Another three iterations of the algorithm are then performed with the value of "DelayStep" decreasing by a factor 2 for every iteration. Examples of the operation of the algorithm are given in the discussion for following FIGS. 10 and 11.

Figure 10:
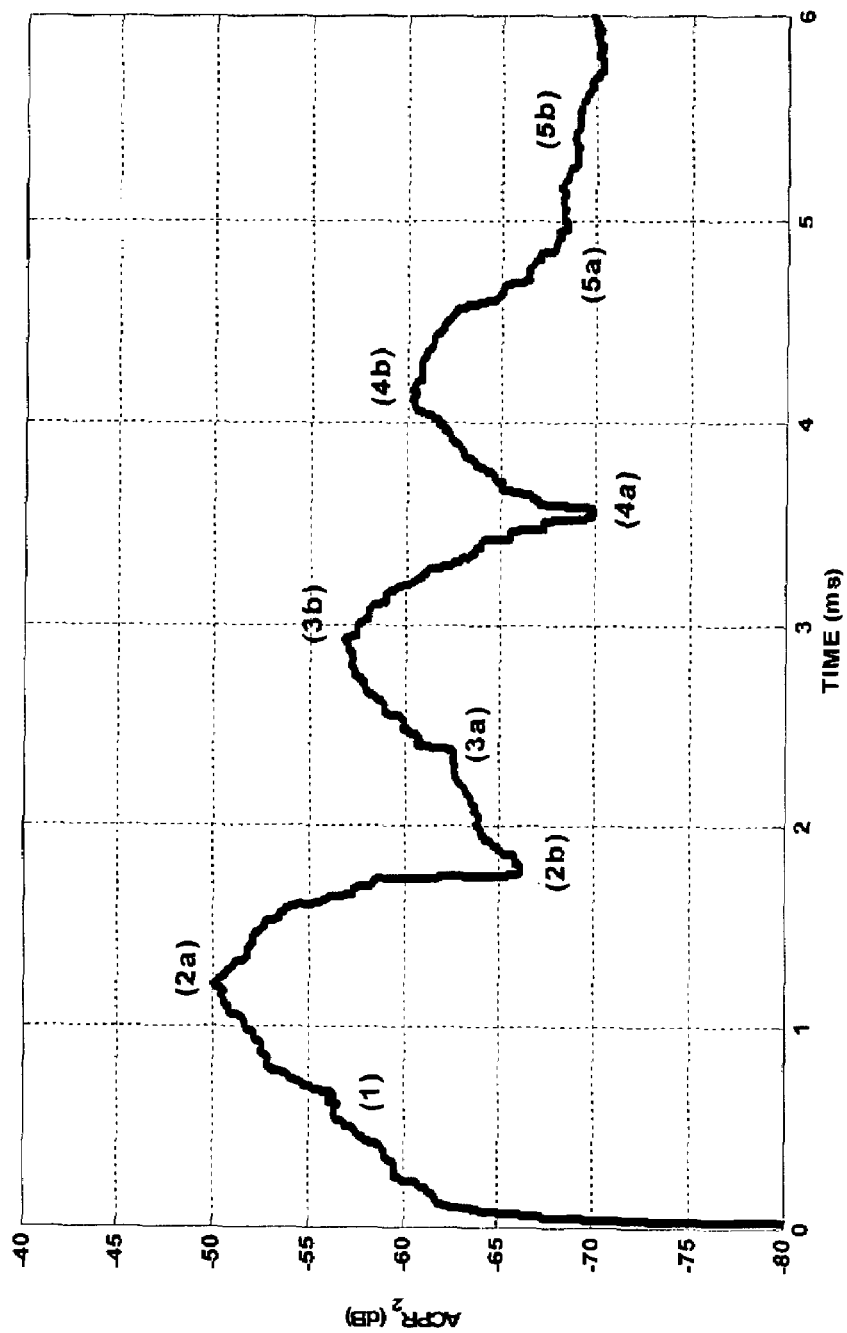
FIG. 10 is a diagram that depicts typical behavior of the measured ACPR.
Figure 11:
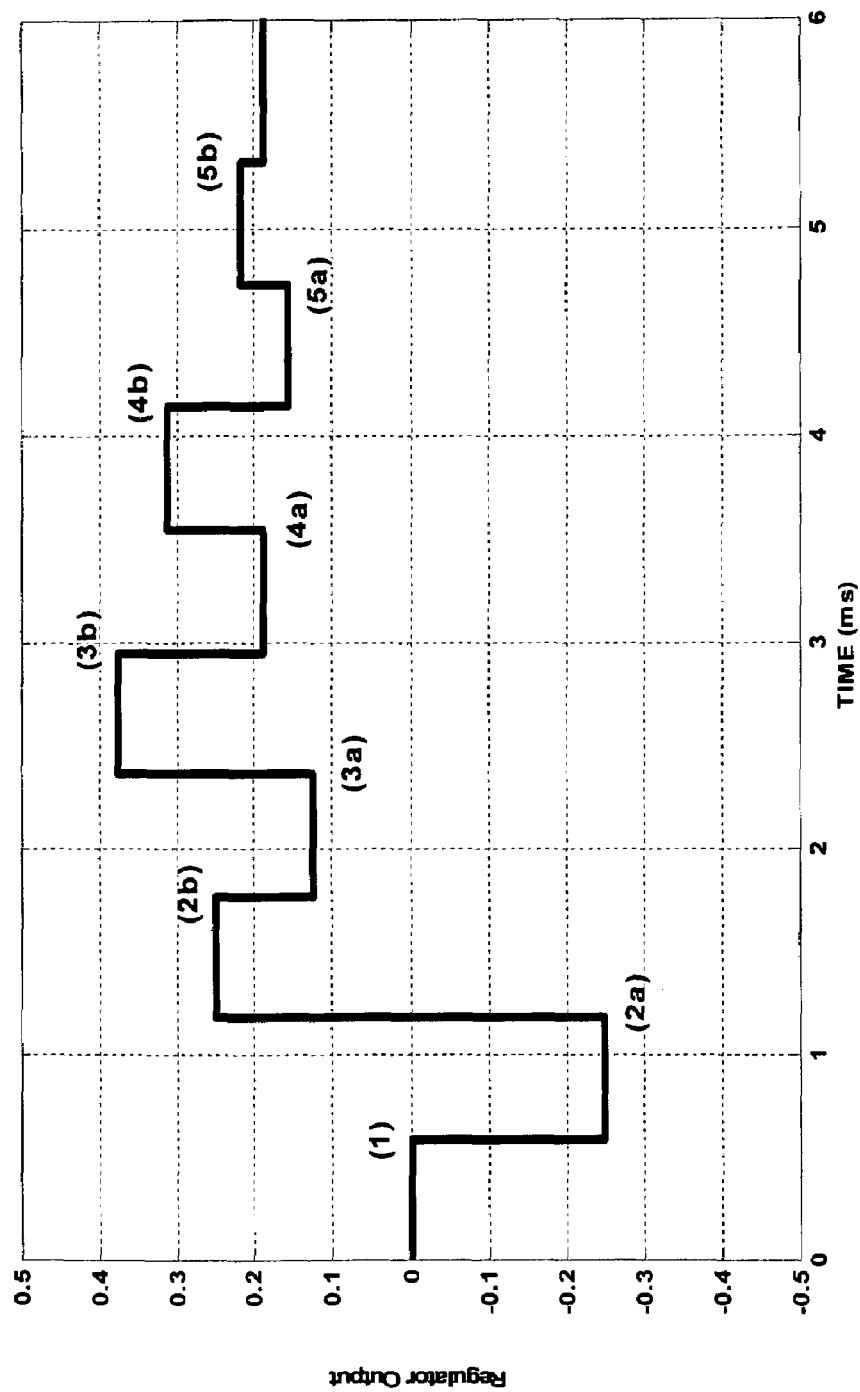
FIG. 11 is a diagram that illustrates typical behavior of the output of the ACPR optimization algorithm.

FIG. 10 and FIG. 11 demonstrate the effectiveness of the invention for the example RF polar transmitter shown in FIG. 6. Also, further insight into the details of the ACPR optimization algorithm block is provided. Specifically, FIG. 10 and FIG. 11 demonstrate the invention for an RF polar transmitter with a delay mismatch of −0.198765432/3.25e6≈−61 ns.

FIG. 10 depicts typical behavior of the measured ACPR, specified in dB, and calculated with the hardware described in the above, versus time specified in milliseconds (ms). FIG. 11 shows typical behavior of the output of the ACPR optimization algorithm. Recall that the delay mismatch of this particular transmitter is −0.198765432/3.25e6. Thus, after regulation, the output of the ACPR optimization algorithm should be very close to +0.198765432 in order to provide the desired delay mismatch cancellation.

FIGS. 10 and 11 include markers that indicate when measurements of the $ACPR_2$ (ACPR of the second adjacent channel) and changes of the output of the ACPR optimization algorithm occur. Initially, at marker (1), a measurement of $ACPR_2$ with TotalSignalDelay=0 is performed. "TotalSignalDelay" is adjusted to the value −0.25 and the corresponding $ACPR_2$ is measured at marker (2a). Next, TotalSignalDelay is adjusted to the value +0.25 and the corresponding $ACPR_2$ is measured at marker (2b). Since the $ACPR_2$ measured at (2b) is less than the $ACPR_2$ measured at (2a), "TotalSignalDelay" is set to the value +0.25. At the same time, a new iteration of the optimization algorithm is started, now with steps in signal delay of half the size. Thus, at marker (2b), the output of the ACPR optimization algorithm is TotalSignalDelay=+0.25−0.25/2=+0.125. Measurements of $ACPR_2$ are then performed at markers (3a) and (3b), respectively, and it is found that none of these yield a better value than that in (2b). Thus, the best value for TotalSignalDelay is unchanged at +0.25. A new iteration is begun after (3b), starting with TotalSignalDelay=+0.25−0.25/4=+0.1875. This time, the $ACPR_2$ value at (4a) is better than the value at (2b), resulting in the optimal value of TotalSignalDelay being changed to +0.1875. The final iteration of the optimization algorithm does not yield any improvement of the measured $ACPR_2$; thus, the algorithm settles at TotalSignalDelay=+0.1875. With reference to the values at (4b), (5a) and (5b) the delay value that produces the value at (4b) produces the lowest measured or detected ACPR value. Thus, the process is terminated and the determined delay value that created value (4b) is produced to a delay block in either the envelope or phase paths of the polar transmitter to provide operation that is satisfactory with respect to spectral mask requirements.

Figure 12:
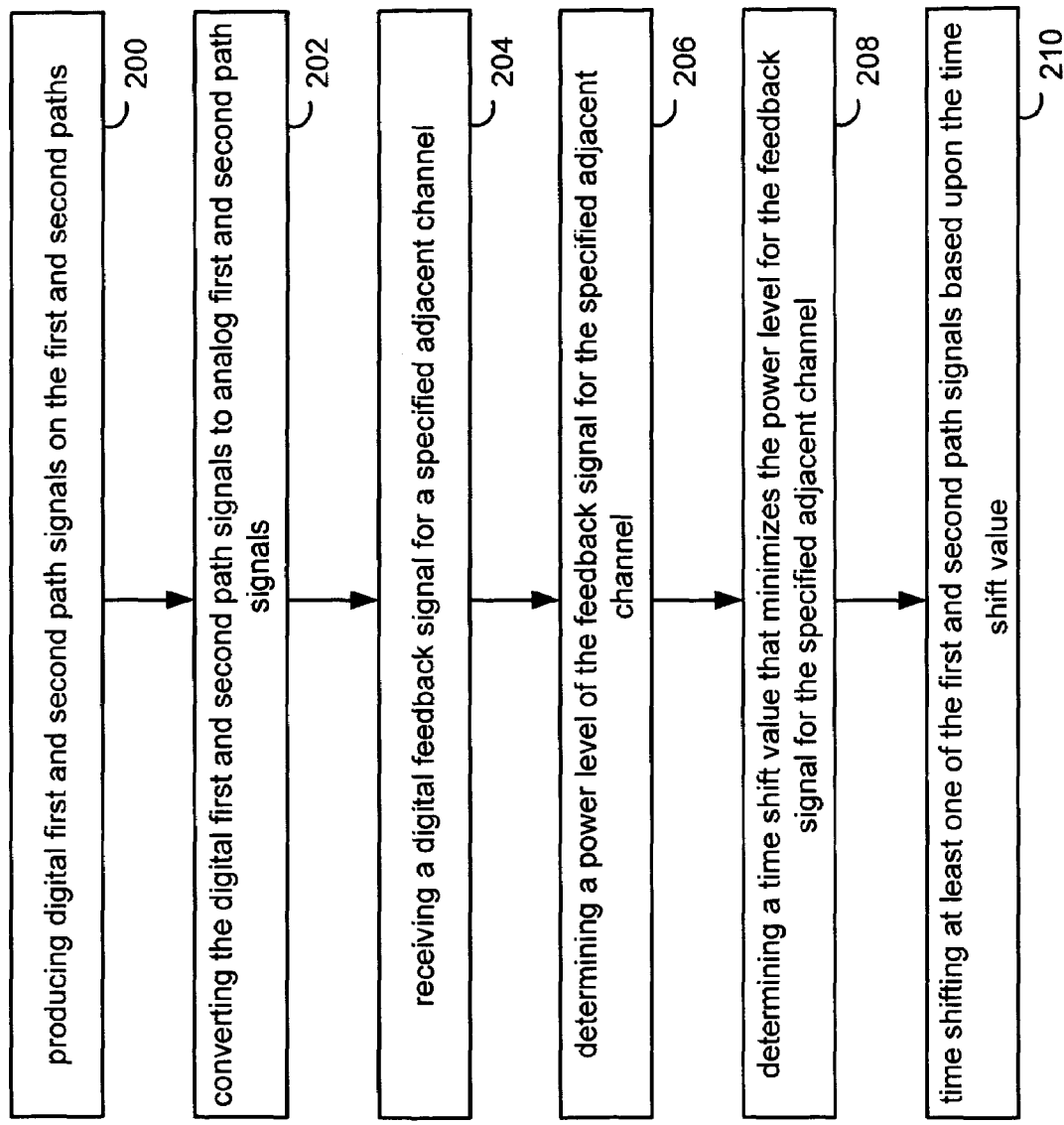
FIG. 12 is a flow chart that illustrates a method of time shifting signals produced on first and second circuit paths according to one embodiment of the present invention.

FIG. 12 is a flow chart that illustrates a method of time shifting signals produced on first and second circuit paths according to one embodiment of the present invention. The method includes initially producing digital first and second path signals on the first and second paths (step 200) and converting the digital first and second path signals to analog first and second path signals (step 202). The first and second paths are then processed and produced to a power amplifier for wireless transmission. Thereafter, the method includes receiving a digital feedback signal for a specified adjacent channel (step 204) and determining a power level of the feedback signal for the specified adjacent channel (step 206). This determined power level is based at least partly upon bleed over power from a primary signal. Thus, the method further includes determining a time shift value that minimizes the power level for the feedback signal for the specified adjacent channel (step 208). In the described embodiment, a binary search algorithm is used to determine a minimum value for the power level. Finally, the method includes time shifting at least one of the first and second path signals based upon the time shift value (step 210). The time shift may be positive or negative in magnitude.

Generally, an RF transmitter includes a digital processor that includes a time shift signal determination block that produces a time shift signal based upon a bleed over power level in an adjacent channel, which bleed over power level is a function of downstream phase and magnitude mismatch of a primary signal. In one embodiment, the time shift signal determination block (or adjacent channel power ratio logic block) includes logic and circuitry for determining a power ratio for a primary signal between a bleed over power level in an adjacent channel and the primary channel. The time shift signal determination block (or adjacent channel power ratio logic block) produces the time shift signal to a time shift block that is operably coupled to receive one of an envelope magnitude component and a phase component from a digital signal generation block, wherein the time shift block generates a time shift in at least one of the envelope signal path and the phase signal path based upon the time shift signal. More specifically, the time shift signal determination block determines a time shift signal value that minimizes the bleed over power level in the adjacent channel (either first or second adjacent channel) through an iterative process. The time shift signal prompts the time shift block to introduce one of a positive or a negative delay in the corresponding signal path (either envelope signal path or phase signal path) to reduce the delay mismatch.

The RF transmitter, and more particularly, the time shift signal determination block, includes a signal frequency shift block for shifting the filtered analog signal to a zero frequency baseband signal, a rotation angle block for producing a rotation angle to the signal frequency block wherein the rotation angle shifts the filtered analog signal to an adjacent channel frequency. an adjacent channel power block for producing an estimate of the adjacent channel power, and a time shift optimization block for producing the time shift signal based on an optimized value of the estimated first adjacent channel power. The time shift optimization block comprises a digital state machine for producing the time shift signal based on an optimization algorithm wherein, in one embodiment of the invention, the digital state machine produces the time shift signal based on a feedback loop delay setting and an N bit resolution setting. In one embodiment, the value of N is equal to four. In the described embodiment of the invention, the digital state machine executes a binary search algorithm to determine an approximate minimum value of the adjacent channel power for the specified adjacent channel. In operation. The digital state machine alternates between taking adjustment steps that decrease in a specified manner, and waiting based upon the feedback loop delay setting to determine a step direction and a step size so lone as N specified iterations are not exceeded. Additionally, the bleed over power level is an averaged value based upon a specified number of samples produced by the feedback loop of the outgoing RF signal. A value of one of $2I^2$, $2Q^2$ or $(I^2+Q^2)$ is averaged for the specified number of samples wherein I and Q represent I and Q channel signal components.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. An RF transmitter, comprising:
   digital processor including a digital signal generation block for producing outgoing digital IF signals comprising an envelope magnitude component and a phase component wherein the envelope magnitude component is produced onto an envelope signal path and wherein the phase component is produced on a phase signal path;

wherein the digital processor further includes:
   time shift signal determination logic that produces a time shift signal based upon a bleed over power level in an adjacent channel, which bleed over power level is a function of downstream phase and magnitude mismatch of a primary signal; and
   a time shift block operably coupled to receive one of the envelope magnitude component and the phase component from the digital signal generation block, wherein the time shift block generates a time shift in at least one of the envelope signal path and the phase signal path based upon the time shift signal, the time shift block further including:
   signal frequency shift block for shifting the filtered digital signal to a zero frequency baseband signal;
   rotation angle block for producing a rotation angle to the signal frequency shift block wherein the rotation angle block shifts the filtered analog signal to an adjacent channel frequency;
   an adjacent channel power block for producing an estimate of adjacent channel power; and
   a time shift optimization block for producing the time shift signal based on an optimized value of the estimated adjacent channel power;
   first and second digital-to-analog converters (DACs) in the envelope signal path and phase signal path, respectively, coupled to receive the envelope magnitude component and phase component of the magnitude and phase signal paths, respectively, the first and second DACs producing outgoing analog envelope and phase components, respectively;
   first and second low pass filters for producing filtered outgoing magnitude and phase components, respectively, based upon the outgoing magnitude and phase components;
   translational loop for up-converting the filtered outgoing phase component from IF to RF to produce an outgoing RF phase component;
   power amplifier that produces an outgoing modulated RF signal based upon the outgoing RF phase component having an outgoing power level based upon the filtered outgoing magnitude component; and
   a feedback loop for producing a feedback signal from the outgoing modulated RF signal to the time shift signal determination block wherein the feedback signal comprises a filtered digital signal.

2. The RF transmitter of claim 1 wherein the time shift optimization block comprises a digital state machine for producing the time shift signal based on an optimization algorithm.

3. The RF transmitter of claim 2 wherein the digital state machine produces the time shift signal based on a feedback loop delay setting and an N bit resolution setting.

4. The RF transmitter of claim 3 wherein N is equal to four.

5. The RF transmitter of claim 2 wherein the digital state machine executes a binary search algorithm to determine an approximate minimum value of the adjacent channel power for the specified adjacent channel.

6. The RF transmitter of claim 5 wherein the digital state machine alternates between taking adjustment steps that decrease in a specified manner and waiting based upon the feedback loop delay setting to determine a step direction and a step size so long as N specified iterations are not exceeded.

7. The RF transmitter of claim 1 wherein the bleed over power level is an averaged value based upon a specified number of samples produced by the feedback loop of the outgoing modulated RF signal.

8. The RF transmitter of claim 7 wherein a value of one of $2I2$, $2Q2$ or $(I2+Q2)$ is averaged for the specified number of samples wherein I and Q represent I and Q channel signal components.

9. A digital processor, comprising:
   a digital signal generation block for producing outgoing digital IF signals comprising an envelope magnitude component and a phase component wherein the envelope magnitude component is produced onto an envelope signal path and wherein the phase component is produced on a phase signal path;
   a time shift signal determination block coupled to receive a digital feedback signal, wherein the time shift signal determination block produces a time shift signal based upon the digital feedback signal, wherein the time shift signal determination block farther includes:
      signal frequency shift block for shifting the digital feedback signal to a zero frequency baseband signal;
      rotation angle block for producing a rotation angle to the signal frequency shift block wherein the rotation angle shifts the filtered analog signal to an adjacent channel frequency;
      an adjacent channel power block for producing an estimate of adjacent channel power;
      a time shift optimization block for producing the time shift signal based on an optimized value of the estimated adjacent channel power; and
   a time shift block operably coupled to receive one of the envelope magnitude component and the phase component from the digital signal generation block, wherein the time shift block generates a time shift in at least one of the envelope signal path and the phase signal path based upon the time shift signal.

10. The digital processor of claim 9 wherein the digital feedback signal includes information that identifies an amount of bleed over power from power spectral growth in a specified adjacent channel.

11. The digital processor of claim 10 wherein the power spectral growth is a function of delay mismatch between the envelope signal path and the phase signal path.

12. The digital processor of claim 9 wherein the time shift optimization block comprises a digital state machine for producing the time shift signal based on an optimization algorithm.

13. The digital processor of claim 12 wherein the digital state machine produces the time shift signal based on a feedback loop delay setting and an N bit resolution setting.

14. The digital processor of claim 13 wherein N is equal to four.

15. The digital processor of claim 12 wherein the digital state machine executes a binary search algorithm to determine an approximate minimum value of the adjacent channel power for the specified adjacent channel.

16. The digital processor of claim 15 wherein the digital state machine alternates between taking adjustment steps that decrease in a specified manner and waiting based upon the feedback loop delay setting to determine a step direction and a step size so long as N specified iterations are not exceeded.

17. The digital processor of claim 10 wherein the bleed over power level is an averaged value based upon a specified number of samples produced by the feedback loop of an outgoing RF signal.

18. The digital processor of claim 17 wherein a value of one of $2I2$, $2Q2$ or $(I2+Q2)$ is averaged for the specified number of samples wherein I and Q represent I and Q channel signal components.

19. A method of time shifting signals produced on first and second circuit paths, comprising:
   producing digital first and second path signals on the first and second circuit paths;
   converting the digital first and second path signals to analog first and second path signals;
   receiving a digital feedback signal for a specified adjacent channel;
   determining a power level of the digital feedback signal for the specified adjacent channel;
   determining a time shift value that minimizes the power level for the digital feedback signal for the specified adjacent channel by:
      shifting the digital feedback signal to a zero frequency baseband signal;
      producing a rotation angle to the signal frequency shift block wherein the rotation angle shifts the filtered analog signal to an adjacent channel frequency;
      producing an estimate of adjacent channel power; and
      producing the time shift signal based on an optimized value of the estimated adjacent channel power; and
   time shifting at least one of the first and second path signals based upon the time shift value.

* * * * *